United States Patent [19]
Confalonieri

[11] Patent Number: 5,349,244
[45] Date of Patent: Sep. 20, 1994

[54] INITIALIZATION CIRCUIT FOR MEMORY REGISTERS

[76] Inventor: Pierangelo Confalonieri, Via Bergamo 6, I-24040 Canonica D'Adda (BG), Italy

[21] Appl. No.: 982,288
[22] Filed: Nov. 25, 1992

[30] Foreign Application Priority Data

Nov. 26, 1991 [IT] Italy .................. M191A 003145

[51] Int. Cl.$^5$ .................................................. H03K 3/01
[52] U.S. Cl. ............................. 307/296.4; 307/272.3; 307/264
[58] Field of Search ............... 307/272.3, 296.4, 264

[56] References Cited

U.S. PATENT DOCUMENTS 5,159,217 10/1992 Mortensen et al. ............. 307/272.3
5,214,316 5/1993 Nagai ............................. 307/272.3

FOREIGN PATENT DOCUMENTS 0096531 6/1983 Japan .......................... H03K 17/22
0342735 5/1989 Netherlands ................ H03K 17/22

OTHER PUBLICATIONS

IBM Tech. Disc. Bul. vol. 29 No. 10 Mar. 1987 "Power-on reset circuit" pp. 4569–4572.
IBM Tech. Disc. Bul. vol. 32 No. 7 Dec. 1989 "Precision Power-on reset" control circuit.
Kopinski, "Battery-sense circuit deactivates quickly," *E.D.N.* (*Electrical Design News*), 33:334, 1988.

Primary Examiner—Margaret Rose Wambach
Attorney, Agent, or Firm—Seed and Berry

[57] ABSTRACT

An initialization circuit, particularly for memory registers, being of a type which comprises a signal input to which a supply voltage is applied, and an initialization output at which a voltage signal is produced which is equal to the supply voltage up to a predetermined tripping value for the circuit, further comprises a second output connected to the register and being also an initialization output driven to a null voltage value upon the supply voltage dropping below the tripping value.

20 Claims, 3 Drawing Sheets

INITIALIZATION CIRCUIT FOR MEMORY REGISTERS

TECHNICAL FIELD

This invention relates to an initialization circuit particularly, but not solely, intended for memory registers. More specifically, the invention relates to a circuit as above which comprises a signal input whereto a voltage supply is applied, and an initialization output whereat a voltage signal is produced which is the equal of the supply voltage before a predetermined circuit tripping value is attained.

BACKGROUND OF THE INVENTION

As is known, many electronic circuits depend for proper configuration on the reception of an initialization or enable signal which will bring the circuit to its design operating condition, when combined with an appropriate voltage supply. The initialization signal may be provided by a purposely arranged circuit.

In general, an initialization circuit produces a signal which follows the rise in the supply voltage up to a predetermined value, then drops to null voltage as that value is exceeded. The threshold value for this change is referred to as the tripping voltage of the initialization circuit, and it matters that the value of this tripping voltage be appropriate for the design of the circuit to be driven to the "on" state.

It is a well-recognized fact, for instance, that analog circuits generally require higher initialization voltage values than digital circuits. Further, the tripping voltage should be at all times a value that will properly set all the circuits affected by the initialization. With integrated circuits of the MOS or CMOS types, that voltage is also tied to the transistor thresholds. It should be further observed that most initialization circuits become automatically operative in those situations where the supply voltage drops to a level below the tripping voltage and no longer ensures proper operation of the circuit networks. The circuit network would also have to be re-initialized when the supply voltage is restored to the steady-state value. However, with some electronic devices, this mode of operation of the initialization circuits may be an untoward one.

Let us consider the instance of circuit networks making up memory registers programmable by a microprocessor unit. With many registers, a requisite is that their configurations upon turning on meet certain specifications, commonly referred to as the default values, which are designed to set a circuit network for operation in its normal mode. Accordingly, the initialization circuit should be capable of activating the memory register in the default state provided for by the specifications.

It happens, however, that upon the supply voltage attaining the steady-state value, the contents of the memory register may undergo changes, and if significant surges contemporaneously occurred in the power supply, the initialization circuit would re-configure the memory register so as to re-establish the default state, as explained above. Thus, what is beneficial to standard circuits to be initialized would instead harm memory registers for which restoration to the default state represents a stable error that is retained until the next write operation by the program unit.

As a practical example, it may suffice to consider that an elemental memory cell implemented in CMOS technology and operated at 5 volts is apt to retain the logic value which has been stored therein, even at very low supply values of less than 1 volt. This feature is retained over relatively long time periods and even on the occurrence of sharp supply voltage drops due to abrupt perturbation and/or having very short duration. Therefore, should the initialization circuit associated with the memory become operative under such conditions, the value contained therein would be lost even if the memory as such would be normally tolerant of the momentary perturbation.

SUMMARY OF THE INVENTION

The technical problem underlying this invention is to provide an initialization circuit, particularly intended for memory registers, which has such structural and functional features as to overcome the aforesaid drawback of prior art circuits. This problem is solved by a circuit as previously indicated and defined in the characterizing portion of claim 1.

The features and advantages of a circuit according to the invention will become apparent from the following detailed description of an embodiment thereof, given by way of example and not of limitation with reference to the accompanying drawings.

DETAILED DESCRIPTION OF THE INVENTION

Figure 1:
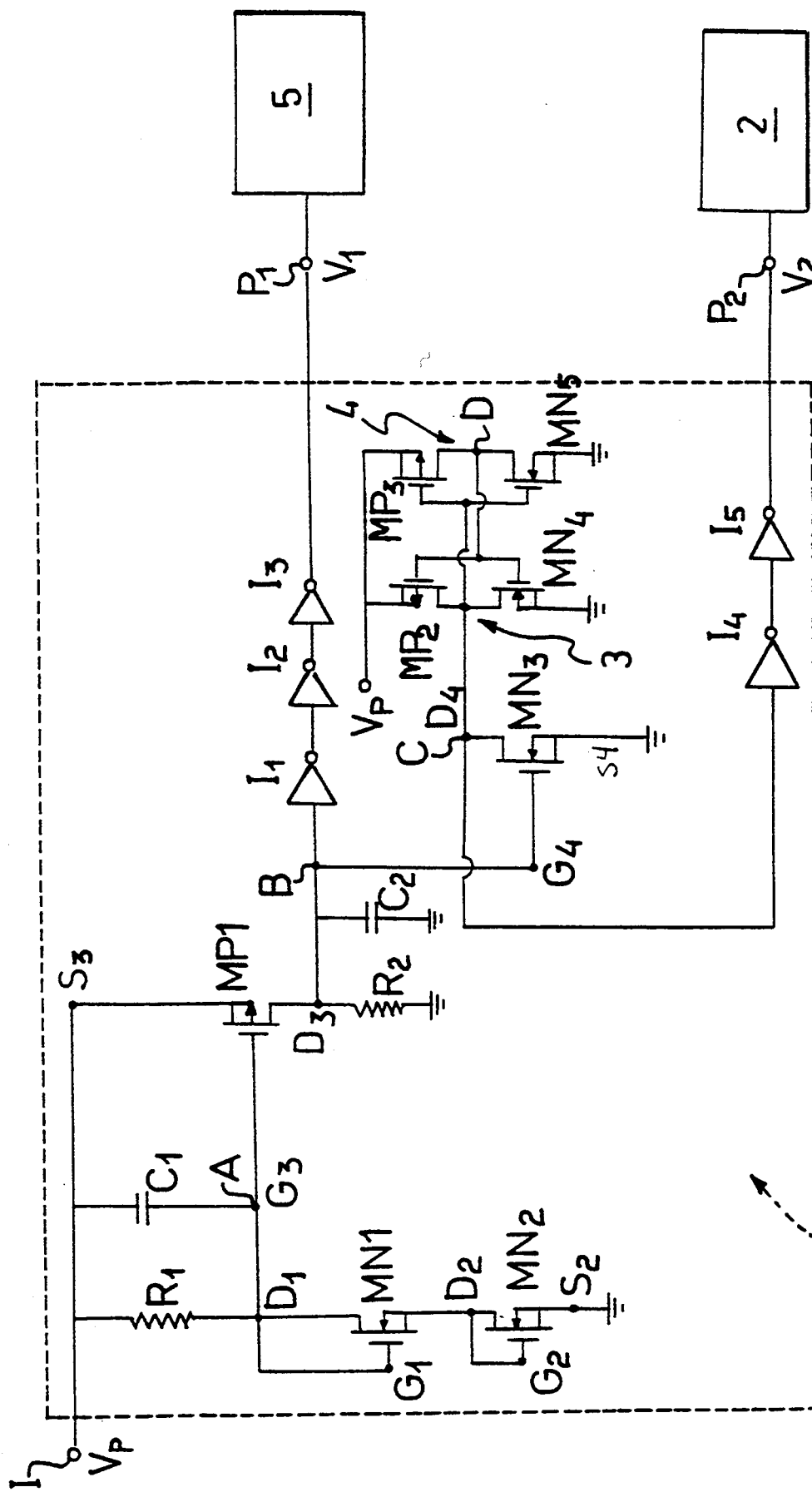
FIG. 1 shows the circuit of the invention in diagram form.
Figure 2:
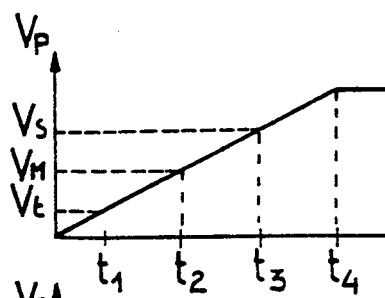
FIGS. 2 through 8 show schematically respective waveforms of signals having the same time base and appearing in the circuit of FIG. 1.

With reference to the drawing figures, generally and schematically shown at 1 is an initialization circuit embodying this invention and being particularly, but not solely, intended for memory registers 2. The circuit 1 has an input terminal I to which a supply voltage Vp is applied.

The circuit 1 comprises a pair of N-channel MOS transistors MN1, MN2 which are connected serially between a circuit node A and ground. Both transistors MN1, MN2 have their gate terminals G1, G2 connected to their corresponding drain terminals D1, D2. Advantageously, the width W and length L of the channel region have been selected for the transistors MN1 and MN2 to be identical and given by W=100 $\mu$ and L=6 $\mu$, thereby to provide a low impedance.

The node A is coincident with the drain terminal D1 of the first transistor MN1 which is connected to the positive voltage supply pole Vp through an RC circuit consisting of a 350 k$\Omega$ resistor R1 and a 2 pF capacitor C1 in parallel. Said node A is also connected to the gate terminal G3 of a third transistor MP1, also a MOS type but of the P-channel variety, which has its source terminal S3 connected to the supply pole Vp and its drain terminal D3 connected to ground through an RC circuit consisting of a 350 k$\Omega$ resistor R2 and a 2 pF capacitor C2 in parallel. The channel region of transistor MP1 has the following dimensions: W=50$\mu$ and L=8$\mu$; and the drain D3 of that transistor forms a second circuit node denoted by B.

The circuit 1 of this invention is provided with a pair of terminals P1 and P2 constituting initialization outputs, of which the former, P1, is connected to a circuit network 5 and the latter, P2, is connected to the memory register 2. Between the circuit node B and the output P1 there are three cascade-connected inverters I1, I2 and I3. In addition, said second node B is connected to the gate terminal G4 of a fourth N-channel MOS transistor MN3 having W=30μ and L=3μ and its source S4 connected to ground. A third circuit node C consists of the drain D4 of the fourth transistor MN3 and is connected to the second output P2 through a pair of inverters I4, I5 in series with each other.

The circuit 1 construction is completed by further MOS transistors. Specifically, a first pair 3 of P-channel and N-channel transistors, respectively MP2 and MN4, are provided which are connected together into an inverter configuration. Transistor MP2 has dimensions given by W=12μ and L=1.5μ, while the other transistor, MN4, has W=2μ and L=18μ.

A second pair 4 of transistors MP3, MN5, also connected into an inverter configuration, with the former being a P-channel type and the latter an N-channel type, are connected in the circuit 1 by a feedback cross-connection to the first pair 3. In essence, the gate terminals of the first pair 3 are connected to a node D, the point of drain-to-drain contact of the second pair 4. Conversely, the gate terminals of the second pair 4 are connected to the point of drain-to-drain contact of the first pair 3 as well as to the third circuit node C.

The transistors MP3 and MN5 of the second pair 4 are respectively characterized by the following dimensional parameters: W=2μ and L=6μ for MP3; W=4μ and L=1.5μ for MN5. It is evinced from the above that the dimensions of the transistors MP3 and MN5 in the second pair 4 are effective to make the P channel much more resistive than the N channel, whereby a low tripping voltage is provided for the inverter. Conversely, the first transistor pair 3 will have the P channel much more conductive than the N channel, which imparts a high tripping voltage to the inverter.

The operation of the circuit 1 according to the invention will now be described with reference to FIGS. 2 to 8, which show waveforms on a common base of voltage signals present in this circuit.

Figure 3:
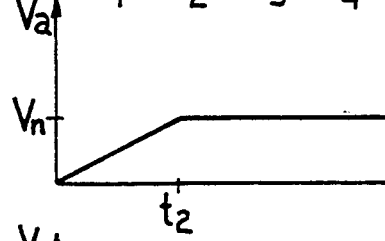
Figure 4:
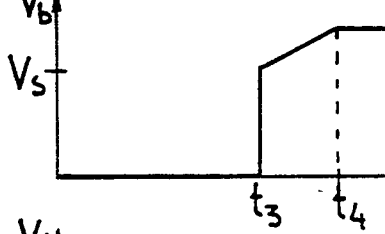

As the power supply voltage Vp rises toward the steady state value (FIG. 2), the voltage Va at the node A also rises up to a value, at time t2 (as shown in FIG. 3), which is the sum of the threshold voltages Vt of transistors MN1 and MN2 of FIG. 1. Since the resistance of R1 is quite high, a further small increment δN in voltage will establish at the node A a stable voltage value Vn=2Vt+δN, and this even if the power supply voltage, Vp, continues to rise.

Referring to FIG. 1, the third transistor MP1 is held off until the voltage between the pole Vp and the gate G3 attains the conduction threshold Vh for that transistor; at this time, a small voltage increment δP will also impart an impedance to the P channel of the third transistor which is negligible compared to that of resistor R2. Thus, before the voltage supply Vp attains the tripping threshold Vs, given by the following equation:

$$Vs = Vn + Vh + \delta P = 2Vt + \delta N + Vh + \delta P,$$

the voltage at node B will stay null and the voltage output of the inverter I1 will rise. The voltage at the output of inverter I1 will eventually change to null value on the tripping voltage Vs being exceeded.

Figure 5:
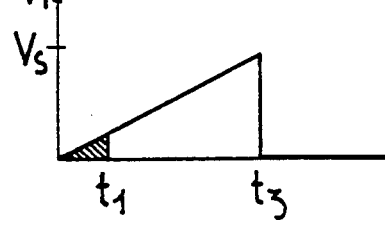

This situation is illustrated by FIG. 5, wherein V1 denotes the voltage value at the circuit output P1, which value substantially corresponds to the output from the inverter I1, since the function served by the other inverters I2, I3 is merely one of speeding up the change-over edge on attainment of the threshold Vs for tripping. As a result, so long as the power supply is held below the tripping voltage Vs, the output P1 of the circuit 1 will keep initializing the circuit 5 coupled thereto.

It matters to observe here that the circuit 1 retains the same behavior over time, and accordingly, should the supply voltage Vp drop once again below the tripping threshold Vs, the signal V1 at the output P1 would act to re-initialize circuits 5, as shown in FIG. 5. Within a context such as this, the provision of the capacitors C1 and C2 ensures for the circuit 1 ready response features to surges in the power supply.

Figure 6:
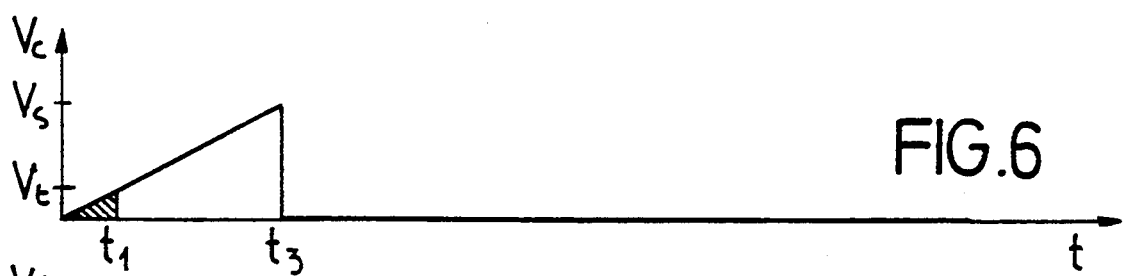
Figure 7:
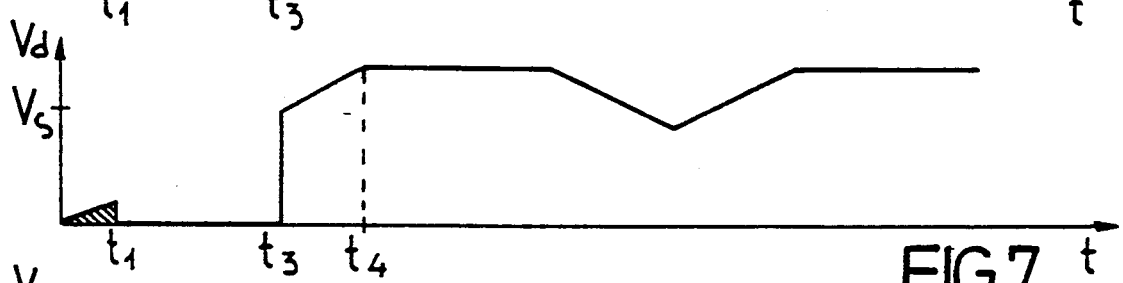

The voltage level changes of the other nodes C and D of the circuit 1 will now be discussed. As previously mentioned, the inverter pairs 3 and 4 are unbalanced, they having different tripping voltages. This implies that the feedback connection of such inverters 3 and 4 prevents the nodes C and D from attaining the same voltage value at the end of the transient. That is, starting from an initial state wherein both nodes C and D are at null voltage, the circuit will evolve to bring the voltage Vc at node C to the supply potential Vp and the voltage Vd at node D to ground potential (FIGS. 6 and 7). The imbalance between the inverters 3 and 4 is apt to persist until the fourth transistor MN3 goes into conduction, which would occur at time t3 when the voltage Vb at the second node B attains the tripping value Vs. Under this condition, the situation on the nodes C and D is reversed, and whereas the third node C is driven to ground, the voltage Vd at the node D rises sharply toward the supply value Vp.

Figure 8:
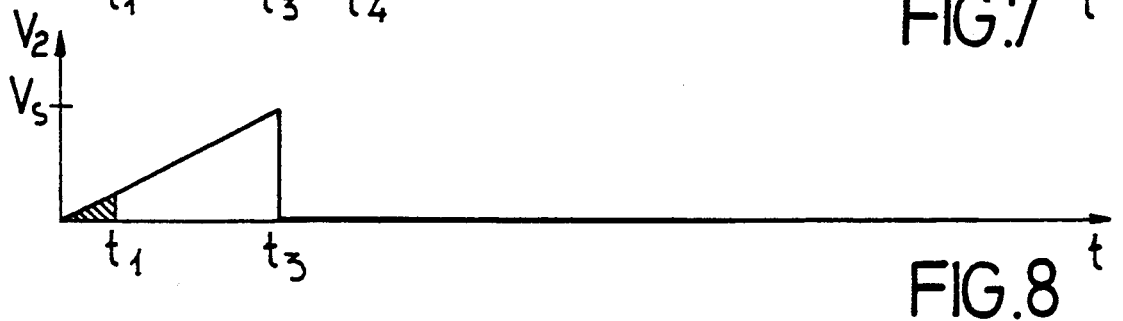

The voltage V2 present at the circuit output P2 and shown in FIG. 8 substantially corresponds to the voltage Vc at the third node C because the inverters 14 and 15 only act to speed up the down edge of the signal Vc at node C. It can, therefore, be appreciated from the foregoing discussion that as the supply voltage Vp drops below the tripping threshold Vs, the third node C is held at ground potential by the presence of the supply voltage Vp at the other node D. Thus, the signal V2 at the second output of the circuit 1 will be held at zero volts. This signal V2 will only become operative again in case the power supply is cut off and then restored.

Advantageously, the provision of the resistors R1 and R2 in the circuit 1 causes the voltage at the second node B to be held effectively null until time t3, when the power supply reaches the tripping threshold Vs. Thus, the initialization circuit 1 of this invention affords a major advantage in that it can either operate conventionally, by virtue of the output P1 re-initializing the circuit networks connected to it even when the power supply drops below the threshold Vs, or in a mode effective to initialize the memory registers, through the output P2. The time evolution of the signal at the second output P2 sustains the memory circuit programs and only performs the appropriate initialization when this becomes actually necessary.

The inventive circuit may be implemented in integrated form, in which case the resistors R1 and R2 would be provided in the N wells or P wells beneath the layers of any metallization path provided.

I claim:

1. An initialization circuit for memory registers, comprising:

a signal input terminal for receiving a supply voltage, the supply voltage increasing from a null voltage upon initialization;

a first initialization circuit portion connected to the signal input terminal, the first initialization circuit portion producing a first initialization voltage in response to the supply voltage, the first initialization voltage being proportional to the supply voltage when the supply voltage is below a predetermined tripping value and being a null voltage when the supply voltage exceeds the tripping value;

a second initialization circuit portion for producing a second initialization voltage in response to the supply voltage, the second initialization voltage being proportional to the supply voltage until the supply voltage exceeds a second tripping value, the second initialization voltage being equal to a null voltage thereafter;

a first output terminal connected to the first initialization circuit portion for providing a first output voltage corresponding to the first initialization voltage; and a second output terminal connected to the second initialization circuit portion for providing a second output voltage corresponding to the second initialization voltage.

2. The circuit of claim 1 wherein the second tripping value is different from the first tripping value.

3. The circuit of claim 1 wherein the second tripping value is equal to the first tripping value.

4. The circuit of claim 1 wherein after the supply voltage exceeds the second tripping value the second initialization voltage remains at the null voltage unless the supply voltage equals the null voltage after having exceeded the second tripping value.

5. A circuit according to claim 4, wherein said second initialization circuit portion comprises a pair of inverters in a cross-connection feedback relationship with each other, each pair of inverters being connected to receive the first initialization voltage at a respective input terminal.

6. A circuit according to claim 5, characterized in that each of said inverters comprises a pair of MOS transistors of the P-channel and N-channel types, respectively, wherein a drain terminal of each of the P-channel transistors is connected to a drain terminal of its corresponding N-channel transistor at a drain-to-drain contact point and a gate terminal of each of the transistors in the first pair of transistors is connected to the point of drain-to-drain contact of the second pair of transistors, and a gate terminal of each of the transistors in the second pair of transistors is connected to the point of drain-to-drain contact of the first pair of transistors.

7. A circuit according to claim 5, characterized in that said inverters are unbalanced inverters having different tripping voltages.

8. A circuit according to claim 4, wherein the first initialization circuit portion comprises:

a pair of MOS transistors connected in series between the gate terminal of the first MOS transistor and ground;

an RC circuit connected in parallel between said gate of the first MOS transistor and said signal input terminal; and a second RC circuit connected in parallel between the drain of the first MOS transistor and ground, and at least one inverter connected intermediate said drain of said first MOS transistor and said first output terminal.

9. A circuit according to claim 8, comprising three inverters serially connected between said drain of said first MOS transistor and said first output terminal.

10. A circuit according to claim 8, characterized in that the drain of said first MOS transistor is also connected to the gate of a fourth MOS transistor having its source terminal connected to ground and its drain terminal connected to the second output terminal through at least one inverter.

11. A circuit according to claim 10, characterized in that two serial inverters are connected between the drain terminal of the fourth transistor and said second output terminal.

12. A circuit according to claim 8, characterized in that said first MOS transistor is a P-channel MOS type.

13. A circuit according to claim 12, characterized in that said fourth transistor is an N-channel MOS type.

14. A circuit for electrical initialization, comprising:

an initialization circuit portion for producing a first initialization output voltage, the initialization circuit portion having a supply voltage input terminal for receiving a supply voltage and a voltage output terminal, the first initialization output voltage being proportional to the supply voltage at supply voltage levels below a threshold voltage and the first initialization output voltage being equal to a null voltage at supply voltage levels above the threshold voltage;

an output driver portion connected to the output terminal of the initialization circuit portion, the output driver portion having an output terminal and producing a voltage proportional to the first initialization output voltage at the output terminal; and a second circuit portion connected to the first voltage output terminal, the second circuit portion having a second initialization output terminal and producing a second initialization output voltage at the second initialization output terminal upon application of a supply voltage to the supply voltage input terminal, the second initialization output voltage being proportional to the supply voltage upon an initial application of the supply voltage until the supply voltage reaches the threshold voltage and the second initialization output voltage being a null voltage thereafter.

15. The circuit of claim 14, wherein the second circuit portion further includes:

an opposing inverter pair, including a pair of inverters in a cross-connection feedback configuration, the opposing inverter pair connected electrically between the first voltage output terminal and an output driver portion of the second circuit portion.

16. The circuit of claim 15 wherein each of said inverters comprises a pair of MOS transistors of the P-channel and N-channel types.

17. The circuit of claim 15 wherein the first inverter has a first inverter tripping voltage and the second inverter has a second inverter tripping voltage, the first inverter tripping voltage being different from the second inverter tripping voltage.

18. The circuit of claim 14, wherein the first initialization portion includes:

a primary transistor having a gate terminal, drain terminal, and source terminal, the source of the primary transistor being connected electrically to the supply voltage input and the drain of the primary transistor being connected electrically to the first initialization output terminal;

a parallel circuit, including a resistor and capacitor connected in parallel, the parallel circuit being connected electrically between the source of the primary transistor and the gate of the primary transistor;

a triggering transistor pair serially electrically connected between the gate of the primary transistor and ground; and a second parallel circuit, including a resistor and capacitor in parallel, the second parallel circuit being electrically connected in parallel between the drain of the primary transistor and ground.

19. The circuit of claim 18 wherein the second circuit portion includes:

a second primary transistor having a second primary gate, second primary drain, and second primary source, the gate of the second primary transistor being connected electrically to the first initialization output terminal, the second primary source being connected electrically to ground and the second primary drain being connected electrically to a second initialization portion output; and an unbalanced inverter pair having an inverter pair input, an inverter pair output and an inverter pair reference, the inverter pair input being connected electrically to the supply voltage input, the inverter pair reference being connected electrically to ground and the inverter pair output being connected electrically to the second primary drain.

20. An initialization circuit for memory registers, comprising:

a signal input terminal for receiving a supply voltage, the supply voltage increasing from a null voltage upon initialization;

a first initialization circuit portion connected to the signal input terminal, the first initialization circuit portion producing a first initialization voltage in response to the supply voltage, the first initialization voltage being proportional to the supply voltage when the supply voltage is below a predetermined first tripping value and being a null voltage when the supply voltage exceeds the tripping value;

a second initialization circuit portion connected to receive the first initialization voltage from the first initialization circuit portion, the second initialization circuit portion producing a second initialization voltage in response to the first initialization voltage, the second initialization voltage being proportional to the first initialization voltage until the first initialization voltage exceeds a second tripping value, the second initialization voltage being equal to a null voltage thereafter unless the supply voltage equals the null voltage after having exceeded the second tripping value;

a first output terminal connected to the first initialization circuit portion for providing a first output voltage corresponding to the first initialization voltage; and a second output terminal connected to the second initialization circuit portion for providing a second output voltage corresponding to the second initialization voltage.

* * * * *